(12) United States Patent
Lang et al.

(10) Patent No.: US 8,822,313 B2
(45) Date of Patent: Sep. 2, 2014

(54) SURFACE TREATMENT METHODS AND SYSTEMS FOR SUBSTRATE PROCESSING

(71) Applicant: Intermolecular, Inc., San Jose, CA (US)

(72) Inventors: Chi-I Lang, Cupertino, CA (US); Sandip Niyogi, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/722,820

(22) Filed: Dec. 20, 2012

(65) Prior Publication Data

US 2014/0179113 A1    Jun. 26, 2014

(51) Int. Cl.
  *H01L 21/265* (2006.01)
  *H01L 21/365* (2006.01)
  *H01L 21/02* (2006.01)

(52) U.S. Cl.
  CPC ..................... *H01L 21/02* (2013.01)
  USPC ............................ 438/485; 438/788; 438/792

(58) Field of Classification Search
  CPC ................... H01L 21/02126; H01L 21/02274; H01L 21/0234; H01L 21/28556; H01L 21/67207; H01L 21/67253
  See application file for complete search history.

(56) References Cited

U.S. PATENT DOCUMENTS

| 7,942,969 B2 | 5/2011 | Riker et al. | |
| 2011/0129616 A1* | 6/2011 | Ingle et al. | 427/568 |
| 2012/0238103 A1* | 9/2012 | Zhang et al. | 438/720 |

* cited by examiner

*Primary Examiner* — Zandra Smith
*Assistant Examiner* — Pamela E Perkins

(57) ABSTRACT

Embodiments provided herein describe methods and systems for processing substrates. A plasma including radical species and charged species is generated. The charged species of the plasma are collected. A substrate is exposed to the radical species of the plasma. A layer is formed on the substrate after exposing the substrate to the radical species.

16 Claims, 6 Drawing Sheets

SURFACE TREATMENT METHODS AND SYSTEMS FOR SUBSTRATE PROCESSING

The present invention relates to substrate processing. More particularly, this invention relates to methods and systems treating surfaces of substrates during substrate processing.

BACKGROUND OF THE INVENTION

In recent years, the properties of the interfaces between adjacent layers within semiconductor devices have become a more important factor in optimizing performance. This is due, in part, to the ever decreasing size of the features of such devices.

For example, at the interface of the gate electrode layer and the gate dielectric layer, a large dipole is often formed due to the differences in the properties of the two materials used. This is typical in both silicon-based and germanium-based devices. This dipole may adversely affect performance and may indicate a less than ideal bond formed between the two materials.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1:
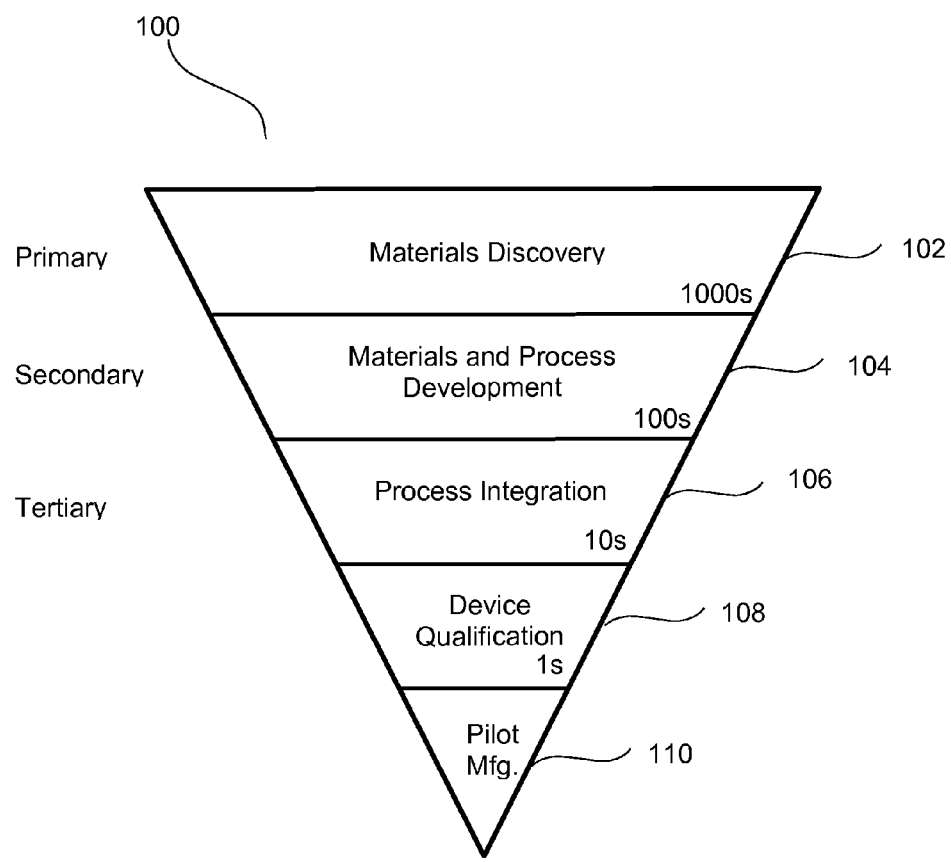
FIG. 1 illustrates a schematic diagram for implementing combinatorial processing and evaluation using primary, secondary, and tertiary screening in accordance with some embodiments of the present invention.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Embodiments described herein provide substrate processing methods and systems for performing a "surface treatment" on a substrate, such as prior to the traditional formation of a layer on the substrate. A remote plasma source is used to generate radical species, ions, and electrons. The charged species (i.e., the ions and electrons) are collected before the substrate is exposed to the plasma, such that only the radicals treat the substrate. After one or more such treatments, a layer may be formed on the substrate using conventional processing techniques, such as atomic layer deposition (ALD).

The surface treatment process may be used to minimize the dipole at the interface of the substrate and the layer formed on the substrate, while allowing a strong bond to be formed. One example of a multi-step surface treatment includes the sequential exposure of the substrate to hydrogen radicals, oxygen radicals, and nitrogen radicals, followed by an additional exposure to hydrogen radicals. Such a sequence causes a monolayer of substrate-oxygen-nitrogen-hydrogen bonds to be formed, which reacts easily with amine-based atomic layer deposition (ALD) precursors, and results in strong substrate-oxygen bonds, but a reduced dipole due to the presence of the oxygen-nitrogen bond at the surface.

In some embodiments, the charged species are collected using a grounded showerhead. An inert gas may be introduced into the showerhead to reduce collisions of the charged species and extend the lifetime of the radicals. In other embodiments, the charge on the showerhead may be modulated to introduce or exclude charged particles. The showerhead, as well as the entire processing tool, may allow for combinatorial processing such that the surface treatment parameters may be varied for different regions on the substrate.

As such, in accordance with some embodiments, combinatorial processing may be used to produce and evaluate different materials, chemicals, processes, and techniques related to thermochromic materials, as well as build structures or determine how thermochromic materials coat, fill or interact with existing structures in order to vary materials, unit processes and/or process sequences across multiple (site-isolated) regions on the substrate(s). These variations may relate to specifications such as temperatures, exposure times, layer thicknesses, chemical compositions, humidity, etc. of the formulations and/or the substrates at various stages of the screening processes described herein. However, it should be noted that in some embodiments, the chemical composition remains the same, while other parameters are varied, and in other embodiments, the chemical composition is varied.

Although the embodiments described herein provide methods and apparatus related to surface treatment, it will be obvious to one skilled in the art that the present invention may be practiced without some or all of these specific details. In other instances, well known process operations have not been described in detail in order not to unnecessarily obscure the present invention.

In the drawings, like reference numerals appearing in different drawings represent similar or same components and perform similar or same functions, unless specifically noted otherwise in the description. Furthermore, as would be appreciated by those skilled in the art, according to common practice, the various features of the drawings discussed herein are not necessarily drawn to scale, and that dimensions of various features, structures, or characteristics of the drawings may be expanded or reduced to more clearly illustrate various implementations of the invention described herein. Semiconductor manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD).

FIG. 1 illustrates a schematic diagram 100 for implementing combinatorial processing and evaluation using primary, secondary, and tertiary screening. The schematic diagram 100 illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage 102. Materials discovery stage 102 is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage 104 may evaluate hundreds of materials (i.e., a magnitude smaller than the primary stage) and may focus on the processes used to deposit or develop those materials. Promising materials and processes are again selected, and advanced to the tertiary screen or process integration stage 106, where tens of materials and/or processes and combinations are evaluated. The tertiary screen or process integration stage 106 may focus on integrating the selected processes and materials with other processes and materials.

The most promising materials and processes from the tertiary screen are advanced to device qualification 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing 110.

The schematic diagram 100 is an example of various techniques that may be used to evaluate and select materials and processes for the development of new materials and processes. The descriptions of primary, secondary, etc. screening and the various stages 102-110 are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007, which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of semiconductor manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture, for example, a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the semiconductor device. For example, such structures may include, but would not be limited to, contact layers, buffer layers, absorber layers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
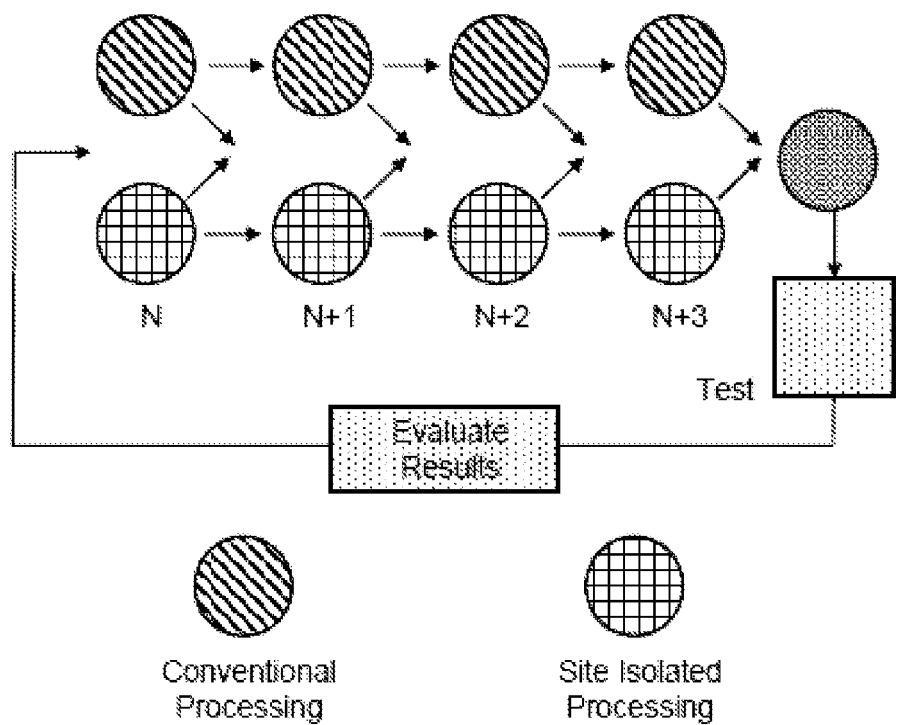
FIG. 2 is a simplified schematic diagram illustrating a general methodology for combinatorial process sequence integration that includes site-isolated processing and/or conventional processing in accordance with some embodiments of the present invention.

FIG. 2 is a simplified schematic diagram illustrating a general methodology for combinatorial process sequence integration that includes site-isolated processing and/or conventional processing in accordance with some embodiments of the invention. In some embodiments, the substrate is initially processed using conventional process N. In some exemplary embodiments, the substrate is then processed using site-isolated process N+1. During site-isolated processing, an HPC module may be used, such as the HPC module described in U.S. patent application Ser. No. 11/352,077 filed on Feb. 10, 2006. The substrate can then be processed using site-isolated process N+2, and thereafter processed using conventional process N+3. Testing is performed and the results are evaluated. The testing can include physical, chemical, acoustic, magnetic, electrical, optical, etc. tests. From this evaluation, a particular process from the various site-isolated processes (e.g. from steps N+1 and N+2) may be selected and fixed so that additional combinatorial process sequence integration may be performed using site-isolated processing for either process N or N+3. For example, a next process sequence can include processing the substrate using site-isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations, the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in some embodiments or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Figure 3:
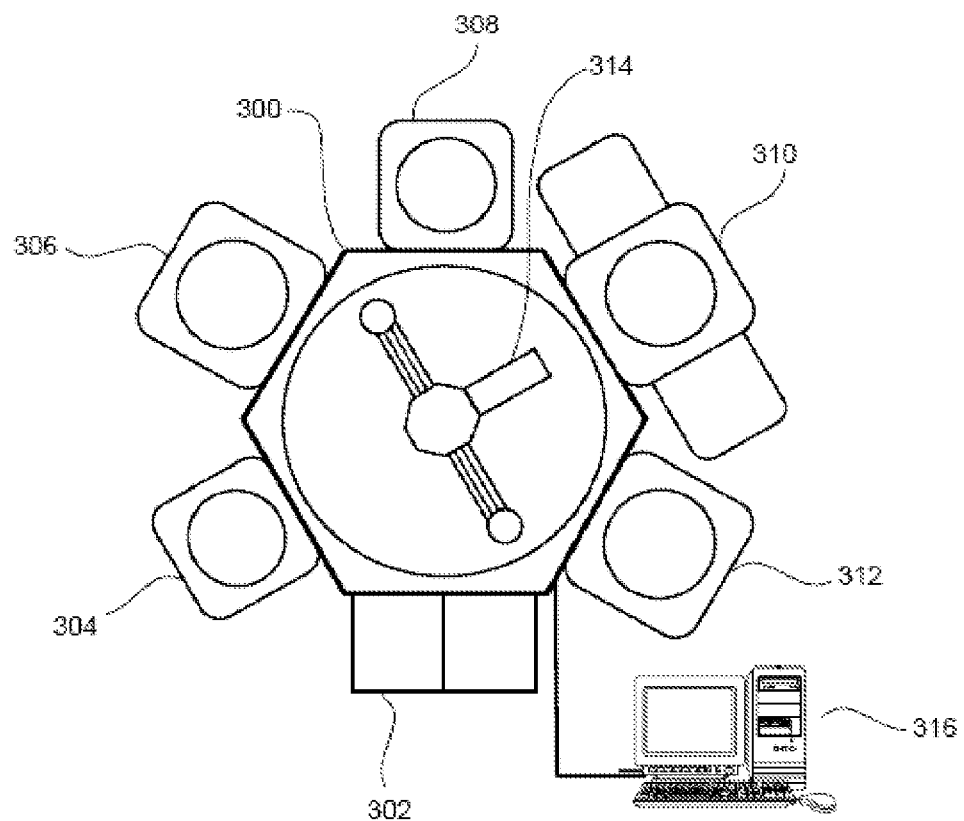
FIG. 3 is a simplified schematic diagram illustrating an integrated high productivity combinatorial (HPC) system in accordance with some embodiments of the present invention.

FIG. 3 is a simplified schematic diagram illustrating an integrated high productivity combinatorial (HPC) system in accordance with some embodiments of the invention. HPC system includes a frame 300 supporting a plurality of processing modules. It should be appreciated that the frame 300 may be a unitary frame in accordance with some embodiments. In some embodiments, the environment within the frame 300 is controlled. Load lock/factory interface 302 provides access into the plurality of modules of the HPC system. Robot 314 provides for the movement of substrates (and masks) between the modules and for the movement into and out of the load lock 302. Modules 304-312 may be any set of modules and preferably include one or more combinatorial modules. For example, module 304 may be an orientation/degassing module, module 306 may be a clean module, either plasma or non-plasma based, modules 308 and/or 310 may be combinatorial/conventional dual purpose modules. Module 312 may provide conventional clean or degas as necessary for the experiment design.

Any type of chamber or combination of chambers may be implemented and the description herein is merely illustrative of one possible combination and not meant to limit the potential chamber or processes that can be supported to combine combinatorial processing or combinatorial plus conventional processing of a substrate or wafer. In some embodiments, a centralized controller, i.e., computing device 316, may control the processes of the HPC system, including the power supplies and synchronization of the duty cycles described in more detail below. Further details of one possible HPC system are described in U.S. application Ser. Nos. 11/672,478 and 11/672,473. With HPC system, a plurality of methods may be employed to deposit material upon a substrate employing combinatorial processes.

Figure 4:
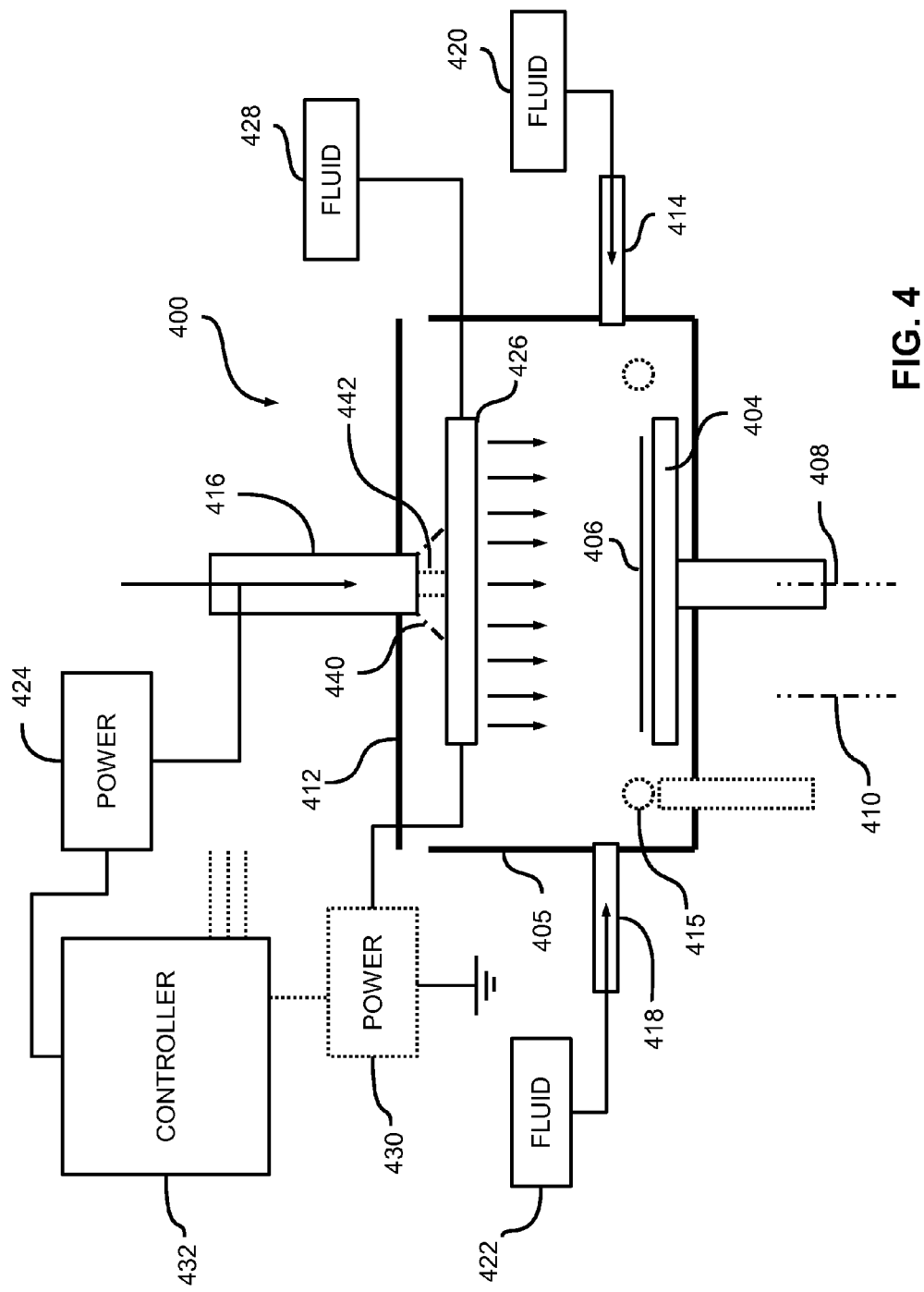
FIG. 4 is a simplified schematic diagram illustrating a processing chamber configured to perform combinatorial processing in accordance with some embodiments of the invention.

FIG. 4 is a simplified schematic diagram illustrating a processing chamber, or substrate processing tool, 400 configured to perform combinatorial processing in accordance with some embodiments of the invention. The processing chamber 400 is defined by a housing that includes a sidewall 405 and a lid 412 and includes a substrate support 404 which is configured to hold a substrate 406 disposed thereon. The substrate support 404 may be any known substrate support, including but not limited to a vacuum chuck, electrostatic chuck or other known mechanisms. The substrate support 404 is capable of both rotating around its own central axis 408 (referred to as "rotation" axis, which is congruent with a central axis of the substrate 406), and rotating around a second axis 410 (referred to as "revolution" axis). Other substrate supports, such as an XY table, can also be used for site-isolated processing. In addition, the substrate support 404 may move in a vertical direction, i.e., away from or towards lid 412. It should be appreciated that the rotation and movement in the vertical direction may be achieved through known drive mechanisms which include magnetic drives, linear drives, worm screws, lead screws, a differentially pumped rotary feed through drive, etc. A power source 424 provides power to plasma generation source 416. It should be appreciated that power source 424 may output a direct current (DC) power supply, a pulsed DC power supply, or a radio frequency (RF) power supply.

The substrate 406 may be a conventional round 200 mm, 300 mm substrate, or any other larger or smaller substrate/wafer size. In some embodiments, the substrate 406 may be a square, rectangular, or other shaped substrate. One skilled in the art will appreciate that the substrate 406 may be a blanket substrate, a coupon (e.g., partial wafer), or even a patterned substrate having predefined regions. In some embodiments, the substrate 406 may have regions defined through the processing described herein. The term "region" is used herein to refer to a localized area on a substrate which is, was, or is intended to be used for processing or formation of a selected material. The region can include one region and/or a series of regular or periodic regions predefined on the substrate. The region may have any convenient shape, e.g., circular, rectangular, elliptical, wedge-shaped, etc. In the semiconductor field a region may be, for example, a test structure, single die, multiple dies, portion of a die, other defined portion of substrate, or an undefined area of a substrate, e.g., blanket substrate which is defined through the processing.

The chamber 400 in FIG. 4 includes a lid 412, through which plasma generation source (or system) 416 extends. Fluid inlets 414 and 418 extend into chamber 400 through sidewalls (or a base) 405 of the chamber 400. Fluid inlet 414 is in fluid communication with fluid source 420, while fluid inlet 418 is in fluid communication with fluid source 422. In other embodiment, fluid inlets 414 and 418 may be in fluid communication with the same fluid source. It should be appreciated that fluid inlets 414 and 418 may extend around a surface of the substrate 406 so that a perimeter of substrate 406 is encompassed by fluid inlets 414 and 418. In some embodiments, fluid inlets 414 and 418 are configured as ring portions surrounding substrate 406.

In some embodiments, fluid inlets 414 and 418 are movable to vertically translate along with the substrate support 404 so that each fluid inlet remains proximate to an edge of substrate 406. For example, the ring portions may be coupled to an appropriate drive such as a worm gear, linear drive, etc., so that the fluid inlets 414 and 418 track the movement of the substrate and substrate support. The plasma generation source 416 is operable to provide a plasma activated species proximate to a surface of substrate 406. The plasma activated species provided by plasma generation source 416 has a non-reactive outer portion 440 surrounding a reactive inner portion 442 in accordance with some embodiments. It should be further appreciated that plasma generation source 416 may be a commercially available inductively coupled radio frequency (RF) plasma generation source. It should be appreciated that a plasma activated species refers to the reactive atomic and molecular radicals converted from the precursor gas through interaction with the plasma. It should be further appreciated that the plasma also consists of non-charged species (e.g., radicals) and charged species (e.g., ions and electrons). Further, it should be understood that the plasma generation source (or system) 416 may include means for generating multiple types of plasma simultaneously.

The embodiments illustrated in FIG. 4 provide for independent control of the plasma and the feedstock of the film to be deposited. Thus, the plasma activated species are provided by the plasma generation source 416 located at the top of the chamber 400, while the film feedstock is delivered through the chamber base to a ring disposed around the wafer surface. Alternatively, the film feedstock may be delivered through the bottom of the chamber to distribution ring 415 above or proximate to the substrate surface. In some embodiments, the distribution ring 415 is coupled to the substrate support 404 so that the ring vertically translates with the substrate support. It should be appreciated that the feedstock interacts with the plasma proximate to a surface of substrate 406 so that site-isolated processing may be performed on different regions of substrate 406. It should be further appreciated that the chamber 400 may be a vapor deposition chamber that includes chemical vapor deposition chambers and atomic layer deposition chambers.

In some embodiments, a plasma provided through the plasma generation source 416 includes a hydrogen, nitrogen, argon, oxygen, ammonia, nitrogen trifluoride, helium, or a combination thereof, based plasma referred to as a first precursor. The film feedstock provided by fluid inlets 414 and 418 may be any suitable feedstock for the desired deposition layer and may be referred to as a second precursor. Thus, for some embodiments described herein, the first precursor carries the plasma activated species and activates the second precursor proximate to the substrate surface at a specific site or region. However, as described below, in accordance with some embodiments of the present invention, only one precursor (i.e., the first) is utilized, and a second precursor is not introduced into the chamber 400.

Still referring to FIG. 4, the chamber 400 also includes a showerhead 426 suspended between the plasma generation source 416 and the substrate 406. Although not shown, the showerhead 426 may be vertically translatable (i.e., movable) within the chamber 400. An additional fluid source 428 is provided and coupled to (i.e., in fluid communication with) the showerhead 426. As described below, fluid source 428 may provide, for example, an inert gas to the showerhead during processing. Additionally, in some embodiments, the showerhead 426 is grounded as shown in FIG. 4. However, in other embodiments, a power supply (and controller) 430 may also be provided to control and modulate the charge on the showerhead 426.

The chamber 400 also includes a controller (or control sub-system) 432 which is in operable communication with the other components of the chamber 400, such as fluid sources 420, 422, and 428, power supply 424, etc. (not all connections are shown for clarity). The controller 432 includes, for example, a processor and memory, such as random access memory (RAM) and a hard disk drive. The controller 432 is configured to control the operation of the chamber 400 to perform the methods and processes described herein.

Figure 5:
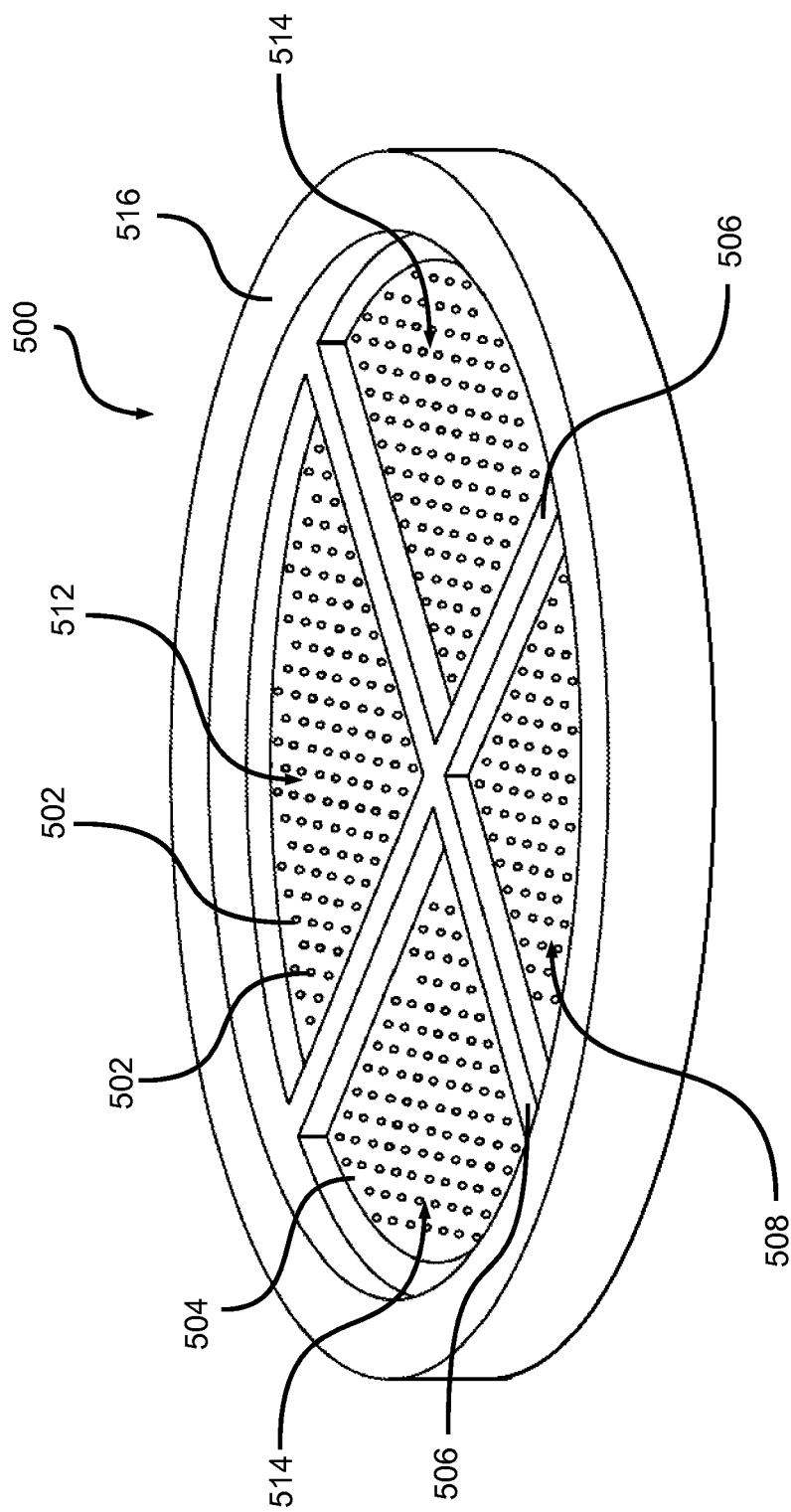
FIG. 5 is an isometric view of a showerhead within the processing chamber of FIG. 4 in accordance with some embodiments of the present invention.

FIG. 5 illustrates a showerhead 500 (e.g., showerhead 426 in FIG. 4) according to some embodiments of the present invention. The showerhead 500 is substantially circular and has a diameter of, for example, approximately 200 or 300 millimeters. A plurality of injection ports (or openings) 502 extend through a bottom portion (or piece) 504 of the showerhead 500. Although not shown in detail, each of the injection ports 502 may have a diameter that varies as it extend through the bottom portion 504, with a larger diameter near an upper surface of the bottom portion 504.

A fluid separation mechanism 506 extends upwards from the bottom portion 504 and includes several substantially linear member that divide the injection ports 502 into four regions, or quadrants, 508, 510, 512, and 514. The distance that fluid separation mechanism 506 extends from the main body is dependent upon the specific design parameters and may vary in different embodiments. However, in at least some embodiments, the fluid separation mechanism 506 provides sufficient separation to minimize, if not prevent, fluids from diffusing between adjacent quadrants 114-117. In some embodiments, quadrants 508, 510, 512, and 514 correspond to similarly shaped, site-isolated regions on the substrate 406 (FIG. 4). As such, the showerhead 500 may allow for combinatorial processing of such regions on the sub Additionally, a fluid trap ring 516 extends upwards from around a periphery of the bottom portion 504 and may assist in containing fluid within the showerhead 500. The showerhead 500 may be formed from any known suitably inert materials, such as stainless steel, aluminum, anodized aluminum, nickel, ceramics and the like.

Referring again to FIG. 4, in some embodiments, the chamber 400 is used to perform "surface treatment" processing on the substrate 406. An example of such a treatment is exposing the substrate 406, or site-isolated regions on the substrate 406, to a plasma substantially including only radical species, or in some embodiments, only including radical species.

For example, is some embodiments, a plasma (e.g., hydrogen plasma) is generated by the plasma generation source 416. The plasma is discharged into the chamber 400 and through the showerhead 426. In some embodiments, at least some, if not all, of the charged species (e.g., ions and electrons) of the plasma are collected in or by the showerhead 426 such that only (or substantially only) the radical species of the plasma is allowed to flow from the injection ports 502 (FIG. 5) and onto the substrate 406. It should be noted that in such a treatment only one precursor (i.e., the plasma) is used, as a second precursor is not introduced into the chamber 400.

The collecting of the charged species by the showerhead 426 may be facilitated by electrically grounding the showerhead, which may cause virtually all of the charged species to be collected by the showerhead 426. However, in other embodiments, the charge on the showerhead 426 may be modulated by power supply 430, which may allow some of the charged species to pass through the showerhead 426 and onto the substrate 406. Additionally, in order to extend the "lifetime" of the radical species, an inert gas, such as argon or krypton, may be introduced into the showerhead 426 by fluid source 428 to reduce collisions with the charged species and allow for a greater number of radical species to be flowed onto the substrate 406.

In some embodiments, this process may be sequentially repeated using different types of plasma. For example, after the treatment described above using a hydrogen plasma (and thus hydrogen radicals), a similar process may be carried out using oxygen plasma (and thus oxygen radicals), followed by a third treatment using nitrogen plasma/radicals and a fourth treatment which again uses hydrogen plasma/radicals. The duration of each of these treatments may be, for example, between 1.0 and 5.0 seconds, and the time between the cessation of one treatment and the beginning of the next may be, for example, less than 1 second. Such a treatment may cause a monolayer of substrate-oxygen-nitrogen-hydrogen bonds to be formed on the substrate 406, which reacts easily with commonly used amine-based ALD precursors, and results in strong substrate-oxygen bonds, but a reduced dipole due to the presence of the O—N bond at the surface.

After the surface treatment processes described above, a layer may be formed on the substrate 406 using a conventional processing technique. Examples of such processing techniques include ALD, PVD, CVD, etc. Thus, the surface treatment techniques described above may be used to facilitate the formation of a subsequently formed layer on the substrate 406, such as by ALD.

Figure 6:
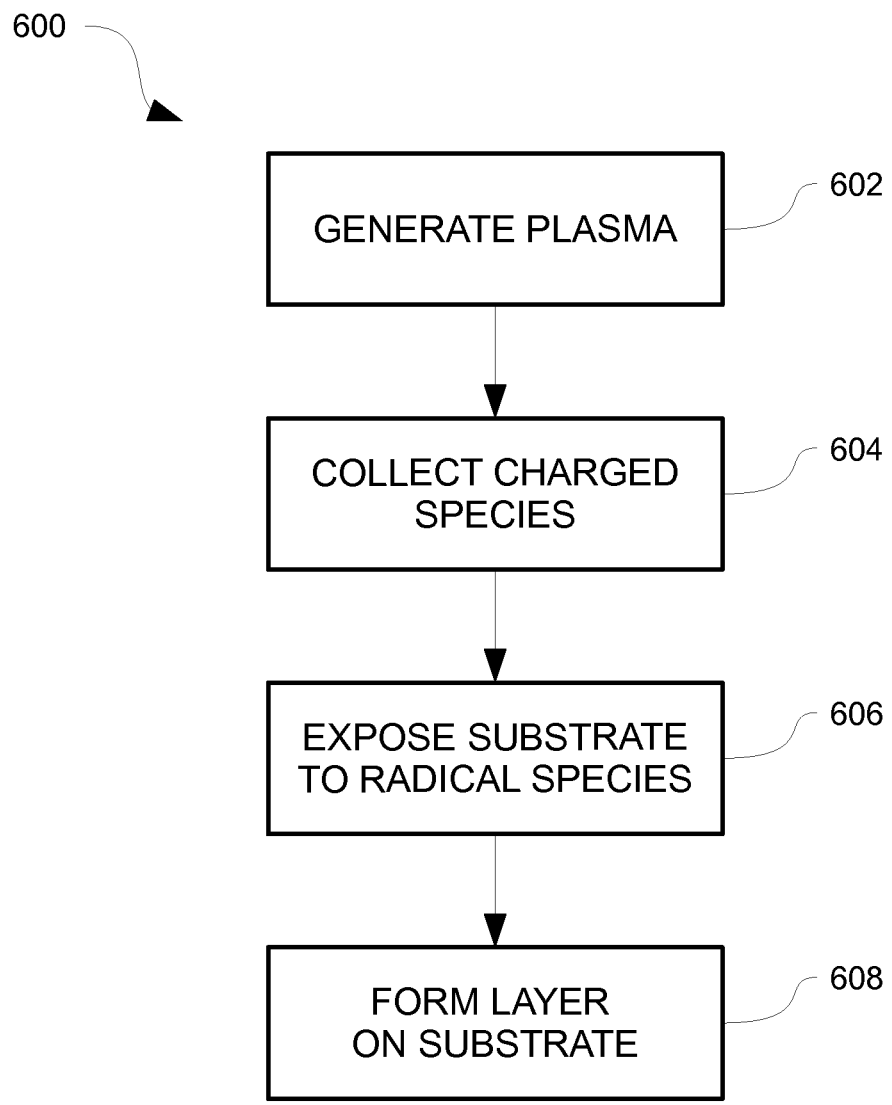
FIG. 6 is a flow chart of a method for processing substrates in accordance with some embodiments of the present invention.

FIG. 6 is a flow chart depicting a method 600 for processing a substrate in accordance with some embodiments of the present invention. At step 602, the method 600 is initiated with a plasma being generated by, for example, the plasma generation source 416 (FIG. 4). As described above, the plasma includes radical species and charged species.

At step 604, the charged species is collected by, for example, the showerhead 426 (FIG. 4) (or showerhead 500 in FIG. 5). The collecting of the charged species may be facilitated by electrically grounding the showerhead 426. Alternatively, some of the charged species may be allowed to pass through the showerhead 426 by modulating the charge on the showerhead 426.

At step 606, the substrate 406 is exposed to the radical species. In some embodiments, the substrate 406 is only exposed to the radical species, as all (or substantially all) of the charged species are collected by the showerhead 426. In other embodiments, the substrate 406 is exposed to the radical species and the charged species of the plasma. It should be understood that the substrate, or site-isolated regions on the substrate, may be exposed to the radical species in a combinatorial manner, as described above.

For example, in some embodiments, radical species flowing from quadrant 508 of showerhead 500 (FIG. 5) may process a first region on the substrate under a first set of processing conditions. Simultaneously, or sequentially, radical species flowing from quadrant 510 of showerhead 500 may process a second region on the substrate under a second set of processing conditions. Likewise, quadrants 512 and 514 may be used to process respective third and fourth regions on the substrate. Additionally, the plasma generation source 416 may be used to generate different plasmas which are used to process different regions on the substrate (i.e., a first plasma/radical species for a first of the regions, a second plasma/radical species for a second of the regions, etc.).

At step 608, a layer is formed on the substrate 406 after the exposure of the substrate 406 to the radical species. As described above, the exposure of the substrate 406 to the radical species may facilitate the formation of the layer.

Implementations of the invention may be described as including a particular feature, structure, or characteristic, but every aspect or implementation may not necessarily include the particular feature, structure, or characteristic. Further, when a particular feature, structure, or characteristic is described in connection with an aspect or implementation, it will be understood that such feature, structure, or characteristic may be included in connection with other implementations, whether or not explicitly described. Thus, various changes and modifications may be made to the provided description without departing from the scope or spirit of the invention. As such, the specification and drawings should be regarded as exemplary only, and the scope of the invention to be determined solely by the appended claims.

Thus, in some embodiments, a method for processing a substrate is provided. A plasma including radical species and charged species is generated. The charged species of the plasma are collected. A substrate is exposed to the radical species of the plasma. A layer is formed on the substrate after exposing the substrate to the radical species.

In some embodiments, a method for processing a substrate is provided. A plasma including radical species and charged species is generated. The plasma is flowed through a showerhead. A charge on the showerhead is controlled during the flowing of the plasma therethrough to collect at least some of the charged species in the showerhead and allow the radical species to pass through the showerhead. A substrate is exposed to the radical species after the plasma is flowed through the grounded showerhead. A layer is formed on the substrate after exposing the substrate to the radical species.

In some embodiments, a method for processing a substrate is provided. A first plasma including a first radical species and a first charged species is generated. The first charged species of the first plasma is collected. A substrate is exposed to the first radical species of the first plasma. A second plasma including a second radical species and a second charged species is generated. The second charged species of the second plasma is collected. The substrate is exposed to the second radical species of the second plasma. A layer is formed on the substrate after exposing the substrate to the radical species.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method for processing a substrate in a chamber, the method comprising:
   generating a plasma in the chamber, wherein the plasma comprises radical species and charged species and the plasma species is based on one of hydrogen, nitrogen, argon, oxygen, ammonia, helium, or a combination thereof;
   collecting the charged species;
   providing the radical species to the substrate, wherein a film feedstock is not provided to the substrate during the providing of the radical species to the substrate; and
   after the providing, depositing a layer on the substrate.

2. The method of claim 1, wherein the radical species comprises a first radical species and a second radical species.

3. The method of claim 2, wherein the providing the radical species comprises sequentially providing the first radical species and the second radical species to the substrate.

4. The method of claim 3, wherein the radical species further comprises a third radical species.

5. The method of claim 4, wherein the providing the radical species further comprises providing the third radical species to a third site-isolated region on the substrate after the providing the second radical species.

6. The method of claim 4, wherein the providing the radical species further comprises re-exposing the substrate to one of the first radical species or the second radical species after the exposing of the substrate to the third radical species.

7. The method of claim 2, wherein the providing the radical species comprises:
   providing the first radical species to a first site-isolated region on the substrate; and
   providing the second radical species to a second site-isolated region on the substrate.

8. The method of claim 1, wherein the collecting of the charged species comprises flowing the plasma through a grounded showerhead.

9. The method of claim 8, further comprising exposing the radical species to an inert gas within the showerhead.

10. A method for processing a substrate in a chamber, the method comprising:
    generating a plasma in the chamber, the plasma comprising radical species and charged species and the plasma species is based on one of hydrogen, nitrogen, argon, oxygen, ammonia, helium, or a combination thereof;
    flowing the plasma through a showerhead;
    controlling a charge on the showerhead during the flowing of the plasma therethrough to collect at least some of the charged species;
    providing the radical species to the substrate, wherein a film feedstock is not provided to the substrate during the providing of the radical species to the substrate; and
    after the providing, depositing a layer on the substrate.

11. The method of claim 10, wherein the providing the radical species comprises sequentially providing a first radical species and a second radical species to the substrate.

12. The method of claim 11, wherein the providing the radical species comprises:
    providing the first radical species to a first site-isolated region on the substrate; and
    providing the second radical species to a second site-isolated region on the substrate.

13. A method for processing a substrate in a chamber, the method comprising:
    generating a first plasma in the chamber, the first plasma comprising a first radical species and a first charged species;

collecting the first charged species;
providing the first radical species to the substrate;
generating a second plasma in the chamber, the second plasma comprising a second radical species and a second charged species;
collecting the second charged species;
providing the second radical species to the substrate; and
after the providing the second radical, depositing a layer on the substrate,
wherein the providing the first radical species and providing the second radical species jointly comprise:
sequentially providing the first radical species to a first site-isolated region on the substrate and providing the second radical species to the first site-isolated region on the substrate under a first set of processing conditions; and
sequentially providing the first radical species to a second site-isolated region on the substrate and providing the second radical species to the second site-isolated region on the substrate under a second set of processing conditions.

14. The method of claim 13, wherein the collecting of the first charged species and collecting the second charged species comprises flowing the first plasma and the second plasma through a showerhead, and further comprising controlling a charge on the showerhead during the flow of the first plasma and the second plasma therethrough.

15. The method of claim 14, wherein the controlling of the charge on the showerhead comprises grounding the showerhead.

16. The method of claim 13, wherein the first radical species and the second radical species each comprise hydrogen radicals, oxygen radicals, nitrogen radicals, or a combination thereof.

* * * * *